(12) United States Patent
Okuhira

(10) Patent No.: US 11,457,766 B2
(45) Date of Patent: Oct. 4, 2022

(54) CORROSION-RESISTANT MEMBER

(71) Applicant: SMC CORPORATION, Chiyoda-ku (JP)

(72) Inventor: Hiroyuki Okuhira, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 657 days.

(21) Appl. No.: 16/470,693

(22) PCT Filed: Sep. 1, 2017

(86) PCT No.: PCT/JP2017/031528
§ 371 (c)(1),
(2) Date: Jun. 18, 2019

(87) PCT Pub. No.: WO2018/116532
PCT Pub. Date: Jun. 28, 2018

(65) Prior Publication Data
US 2020/0085236 A1    Mar. 19, 2020

(30) Foreign Application Priority Data

Dec. 19, 2016 (JP) ............................. JP2016-245205

(51) Int. Cl.
*B32B 9/00* (2006.01)
*A47J 36/02* (2006.01)
(Continued)

(52) U.S. Cl.
CPC ............. *A47J 36/02* (2013.01); *B32B 15/092* (2013.01); *C09D 7/61* (2018.01); *C09D 163/00* (2013.01);
(Continued)

(58) Field of Classification Search
None
See application file for complete search history.

(56) References Cited

U.S. PATENT DOCUMENTS 3,340,212 A * 9/1967 Tomita ..................... H01B 3/30
525/438
9,598,762 B2 3/2017 Mitsuda et al.
(Continued)

FOREIGN PATENT DOCUMENTS

CN 103958728 A 7/2014
JP 2001-191292 A 7/2001
(Continued)

OTHER PUBLICATIONS

Combined Chinese Office Action and Search Report dated Jan. 20, 2021 in Patent Application No. 201780078712.7 (with partial English language translation and English translation of Category of Cited Documents), 7 pages.
(Continued)

*Primary Examiner* — Seth Dumbris
(74) *Attorney, Agent, or Firm* — Oblon, McClelland, Maier & Neustadt, L.L.P.

(57) ABSTRACT

A corrosion-resistant member (10) provided with: a base material (16) made of aluminum or an aluminum alloy; a diamond-like carbon film (18) formed on a surface of the base material (16) and made of amorphous carbon (a-C) or hydrogenated amorphous carbon (a-C:H); and an epoxy resin-containing coating material (20), which at least fills open pores (24) of the diamond-like carbon film (18).

10 Claims, 2 Drawing Sheets

(51) Int. Cl.
  *C09D 163/00* (2006.01)
  *C23C 14/06* (2006.01)
  *C23C 14/08* (2006.01)
  *C23C 14/16* (2006.01)
  *B32B 15/092* (2006.01)
  *C23C 14/02* (2006.01)
  *C23C 16/02* (2006.01)
  *F16C 33/04* (2006.01)
  *C09D 7/61* (2018.01)
(52) U.S. Cl.
  CPC ........ *C23C 14/024* (2013.01); *C23C 14/0605* (2013.01); *C23C 14/0611* (2013.01); *C23C 14/08* (2013.01); *C23C 14/16* (2013.01); *C23C 16/0272* (2013.01); *F16C 33/043* (2013.01); *F16C 2223/60* (2013.01)

(56) References Cited

U.S. PATENT DOCUMENTS

| 10,760,031 | B2 | 9/2020 | Kobayakawa et al. | |
| 2007/0207321 | A1* | 9/2007 | Abe | A61L 27/303 |
| | | | | 427/535 |
| 2008/0063894 | A1 | 3/2008 | Nakashima et al. | |
| 2008/0190284 | A1 | 8/2008 | Sugioka et al. | |
| 2012/0161156 | A1* | 6/2012 | Gies | C23C 28/343 |
| | | | | 438/105 |
| 2014/0287161 | A1 | 9/2014 | Ertas et al. | |
| 2016/0201191 | A1* | 7/2016 | Bucher | C23C 28/00 |
| | | | | 428/336 |

FOREIGN PATENT DOCUMENTS

| JP | 2002-147460 A | 5/2002 |
| JP | 2003-160839 A | 6/2003 |
| JP | 2008-69372 A | 3/2008 |
| JP | 2011-89172 A | 5/2011 |
| JP | 2015-152015 A | 8/2015 |
| JP | 2015-232391 A | 12/2015 |

OTHER PUBLICATIONS

Notice of Reasons for Refusal dated Jan. 21, 2021 in Japanese Patent Application No. 2018-557530 (with English language translation), 6 pages.
Extended European search Report dated Jun. 29, 2020 in European Patent Application No. 17884785.0, 8 pages.
International Search Report dated Dec. 5, 2017 in PCT/JP2017/031528 filed Sep. 1, 2017.
Combined Chinese Office Action and Search Report dated Jul. 8, 2021 in Chinese Patent Application No. 201780078712.7 (with English translation), 19 pages.

* cited by examiner

CORROSION-RESISTANT MEMBER

TECHNICAL FIELD

The present invention relates to a corrosion-resistant member having a base containing aluminum or an aluminum alloy and a diamond-like carbon film formed on a surface of the base.

BACKGROUND ART

For example, an apparatus for treating a beverage or a food is often brought into contact with water, salt water, an acidic or alkaline food or beverage, a cleaning agent, a disinfecting agent, a sanitizing agent, etc. To prevent corrosion in such an environment, the apparatus is prepared using a corrosion-resistant member having a sufficient corrosion resistance. In general, the corrosion-resistant member is composed of a stainless steel as described in Japanese Laid-Open Patent Publication No. 2003-160839, etc.

However, although the stainless steel has an excellent corrosion resistance, the stainless steel has a higher density and requires higher material and processing costs as compared with many metal materials. Therefore, the corrosion-resistant member composed of the stainless steel may have a heavier weight and may require higher production costs. Furthermore, the stainless steel has a low lubricity, and thereby is likely to be abraded due to adhesion. Thus, the stainless steel is poor in slidability, and it is difficult to use the corrosion-resistant member composed of the stainless steel as a shaft member or the like to be slid along a mating member of a bearing member or the like.

In a technology proposed in Japanese Laid-Open Patent Publication No. 2001-191292, an alumite-treated anodic oxide coating or a fluororesin coating is formed on a surface of an aluminum base to obtain a corrosion-resistant member with an improved corrosion resistance or the like. Aluminum has a density lower than that of the stainless steel, and requires lower material and processing costs. Therefore, the weight and the costs of the corrosion-resistant member can be reduced by using the aluminum instead of the stainless steel.

SUMMARY OF THE INVENTION

When the above corrosion-resistant member using the base having the anodic oxide coating or the fluororesin coating is brought into contact with a strong acid, a strong alkali, or the like, the corrosion of the base cannot be sufficiently prevented, and thus the corrosion-resistant member cannot have a sufficient corrosion resistance. Furthermore, the anodic oxide coating or the fluororesin coating on the base cannot function to satisfactorily improve the slidability and the abrasion resistance of the corrosion-resistant member. In addition, in a case where the fluororesin coating is formed on the base by a baking process at a high temperature, the hardness of the base may be deteriorated due to the high temperature.

A principal object of the present invention is to provide a corrosion-resistant member that can have a light weight, can be obtained at low cost, and can exhibit improved slidability and abrasion resistance without deterioration of hardness of a base.

Another object of the present invention is to provide a corrosion-resistant member having an excellent corrosion resistance against a strong acid, a strong alkali, or the like.

According to an aspect of the present invention, there is provided a corrosion-resistant member comprising a base, a diamond-like carbon film, and a coating, wherein the base contains aluminum or an aluminum alloy, the diamond-like carbon film is formed on a surface of the base and contains an amorphous carbon (a-C) or a hydrogenated amorphous carbon (a-C:H), and at least an open hole of the diamond-like carbon film is filled with the coating that contains an epoxy resin.

The corrosion-resistant member of the present invention has the base containing the aluminum or aluminum alloy. The aluminum or aluminum alloy has a density lower than that of the stainless steel or the like, and requires lower material and processing costs. Therefore, the weight and the costs of the corrosion-resistant member can be reduced by using this base.

The diamond-like carbon film containing the a-C or a-C:H (hereinafter referred to also as the DLC film) is formed on the surface of the base. Each of the a-C and a-C:H has a higher ratio of $sp^2$ bonds to $sp^3$ bonds and has a higher flexibility as compared with a tetrahedral amorphous carbon (ta-C) or a hydrogenated tetrahedral amorphous carbon (ta-C:H).

Therefore, the DLC film containing the a-C or a-C:H with a desired thickness can be appropriately bonded to the surface of the base containing the relatively soft material of the aluminum or aluminum alloy, and the DLC film is hardly peeled off from the base. Furthermore, the DLC film has a high hardness and an excellent lubricity. Thus, the corrosion-resistant member containing the DLC film formed on the base can maintain an excellent slidability and an excellent abrasion resistance for a long time.

The DLC film has the open hole (pore) extending to the outside. The open hole is filled with the coating. In other words, the open hole of the DLC film is closed by the coating. The coating contains the epoxy resin, which has a corrosion resistance higher than those of the other resin materials or the like. Therefore, the corrosion resistance of the corrosion-resistant member can be significantly improved by using the coating and the DLC film that is hardly peeled off from the base.

The coating can be formed by a so-called baking treatment containing a step of applying a resin material containing the epoxy resin, a solvent, and the like to the base having the DLC film and a step of heating the applied resin material. For example, the baking treatment can be carried out at a temperature of at most 140° C. to 180° C., i.e. a temperature at which the hardness of the base is not deteriorated. Therefore, unlike a conventional technology containing a high-temperature baking treatment for forming a fluororesin coating, the hardness of the base is not deteriorated due to a high temperature in the process of forming the coating. Consequently, the resultant corrosion-resistant member can be suitably used as a machine part.

As described above, since the corrosion-resistant member contains the base containing the aluminum or aluminum alloy, the corrosion-resistant member can have a light weight, can be obtained at low cost, and can exhibit an excellent slidability and an excellent abrasion resistance due to the DLC film formed on the surface of the base. Furthermore, since the hole of the DLC film is closed by the coating, the corrosion-resistant member has an excellent corrosion resistance not only against water and salt water but also against a strong acid, a strong alkali, and a disinfecting/sanitizing agent such as sodium hypochlorite. In addition, the coating can be formed without heating at the high temperature at which the hardness of the base is deteriorated.

In the corrosion-resistant member, it is preferred that the coating further contains a titanium oxide and a carbon black. In this case, the corrosion resistance of the corrosion-resistant member can be further improved, and particularly the acid resistance can be significantly improved. Therefore, the resultant corrosion-resistant member can exhibit an excellent corrosion resistance even against a strong acid.

In the corrosion-resistant member, it is preferred that a mass ratio of the epoxy resin:the titanium oxide:the carbon black is 5:1:1 to 20:10:10 in the coating. In this case, the corrosion resistance, particularly the acid resistance, of the corrosion-resistant member can be further improved effectively.

In the corrosion-resistant member, it is preferred that the coating further contains a chromium oxide. In this case, the corrosion resistance of the corrosion-resistant member can be further improved, and particularly the alkali resistance can be significantly improved. Therefore, the resultant corrosion-resistant member can exhibit an excellent corrosion resistance even against a strong alkali.

In the corrosion-resistant member, it is preferred that a mass ratio of the epoxy resin:the chromium oxide is 5:1 to 20:10 in the coating. In this case, the corrosion resistance, particularly the alkali resistance, of the corrosion-resistant member can be further improved effectively.

In the corrosion-resistant member, it is preferred that an intermediate layer containing the amorphous carbon (a-C) or the hydrogenated amorphous carbon (a-C:H) of the diamond-like carbon film and aluminum is interposed between the diamond-like carbon film and the surface of the base.

The intermediate layer and the base contain the same aluminum metal material, and therefore the intermediate layer is compatible with the base. Similarly, the intermediate layer and the DLC film contain the same a-C or a-C:H material, and therefore the intermediate layer is compatible with the DLC film. Therefore, the intermediate layer is firmly fixed to both of the base and the DLC film. Thus, the DLC film can be firmly connected to the base by interposing the intermediate layer. Consequently, the corrosion-resistant member can maintain the excellent slidability and abrasion resistance based on the high hardness and lubricity of the DLC film and the excellent corrosion resistance based on the properties of the DLC film and the coating for a long time.

In the corrosion-resistant member, it is preferred that the coating forms a coating layer that covers at least a part of the diamond-like carbon film. In this case, even when the corrosion-resistant member is brought into contact with an acid or an alkali, the acid or alkali can be effectively prevented from reaching the DLC film or the base by the coating layer. Therefore, the corrosion resistance of the corrosion-resistant member can be further improved.

In the corrosion-resistant member, it is preferred that the diamond-like carbon film includes a sliding surface exposed from the coating layer while the open hole is filled with the coating. In a case where the DLC film has the exposed sliding surface, it is possible to take the advantages of the excellent slidability and abrasion resistance of the DLC film effectively. Therefore, in this case, the corrosion-resistant member can be suitably used as a sliding member. The open hole in the sliding surface of the DLC film is filled with the coating. Therefore, the corrosion-resistant member can maintain the excellent corrosion resistance against the water, salt water, strong acid, strong alkali, disinfecting/sanitizing agent (sodium hypochlorite), etc. Consequently, the corrosion-resistant member has all of the excellent slidability, abrasion resistance, and corrosion resistance.

In the corrosion-resistant member, it is preferred that the sliding surface is slid along a mating member that contains a stainless steel, a polyacetal resin, or a polytetrafluoroethylene (PTFE). In this case, abrasion of the sliding surface and the mating member and abrasion of the corrosion-resistant member can be effectively prevented. Therefore, the durations of the corrosion-resistant member and the mating member can be improved. It is further preferred that the mating member contains a stainless steel of SUS304, SUS303, or SUS316.

In the corrosion-resistant member, it is preferred that a fluorine-based grease is interposed between the sliding surface and the mating member. In this case, the abrasion of the sliding surface or the mating member can be further prevented by the fluorine-based grease. The fluorine-based grease has a corrosion resistance higher than those of the other greases. By using a lubricant for a food machinery as the fluorine-based grease, the corrosion-resistant member can be safely brought into contact with a beverage or food.

The corrosion-resistant member can be suitably used as a shaft member with the mating member of a bearing member. The sliding surface of the corrosion-resistant member can exhibit satisfactory slidability and abrasion resistance on the bearing member, and the entire shaft member can exhibit a sufficient corrosion resistance.

It is preferred that the corrosion-resistant member is a member of an apparatus for treating a beverage or a food. As described above, the corrosion-resistant member has the excellent corrosion resistance. Therefore, the corrosion of the corrosion-resistant member can be effectively prevented even when brought into contact with the water, salt water, acidic or alkaline food or beverage, cleaning agent, disinfecting/sanitizing agent, etc. Both of the DLC film and the coating can be safely brought into contact with the beverage or food. Therefore, by using the corrosion-resistant member for the apparatus for treating the beverage or food, while achieving the food safety, the corrosion resistance of the apparatus can be improved, and the weight and cost of the apparatus can be reduced.

The above and other objects, features, and advantages of the present invention will become more apparent from the following description when taken in conjunction with the accompanying drawings in which a preferred embodiment of the present invention is shown by way of illustrative example.

DESCRIPTION OF EMBODIMENTS

A preferred embodiment of the corrosion-resistant member of the present invention will be described in detail below with reference to the accompanying drawings.

For example, the corrosion-resistant member of the present invention can be suitably used as a member of an apparatus for treating a beverage or a food. Examples of such apparatuses include machines for mixing, kneading, stirring, pulverizing, heating, drying, cooling, filling, packing, or storing a raw material or a product of the beverage or food.

The corrosion-resistant member is particularly suitable for use as a shaft member in a rotary shaft or a linear shaft e.g. in a processing machine for kneading, stirring, or pulverizing the beverage or food. In the following example of this embodiment, the corrosion-resistant member is a shaft member, and is used together with a mating member in a plain bearing apparatus for food processing. The mating member is a bearing member for slidably supporting the shaft member. Incidentally, the corrosion-resistant member may be used in an apparatus other than the apparatus for treating the beverage or food, and the apparatus does not have to have the mating member. Furthermore, the corrosion-resistant member and the mating member are not limited to the shaft member and the bearing member respectively. For example, the corrosion-resistant member may be a cylinder body, and the mating member may be a piston.

Figure 1:
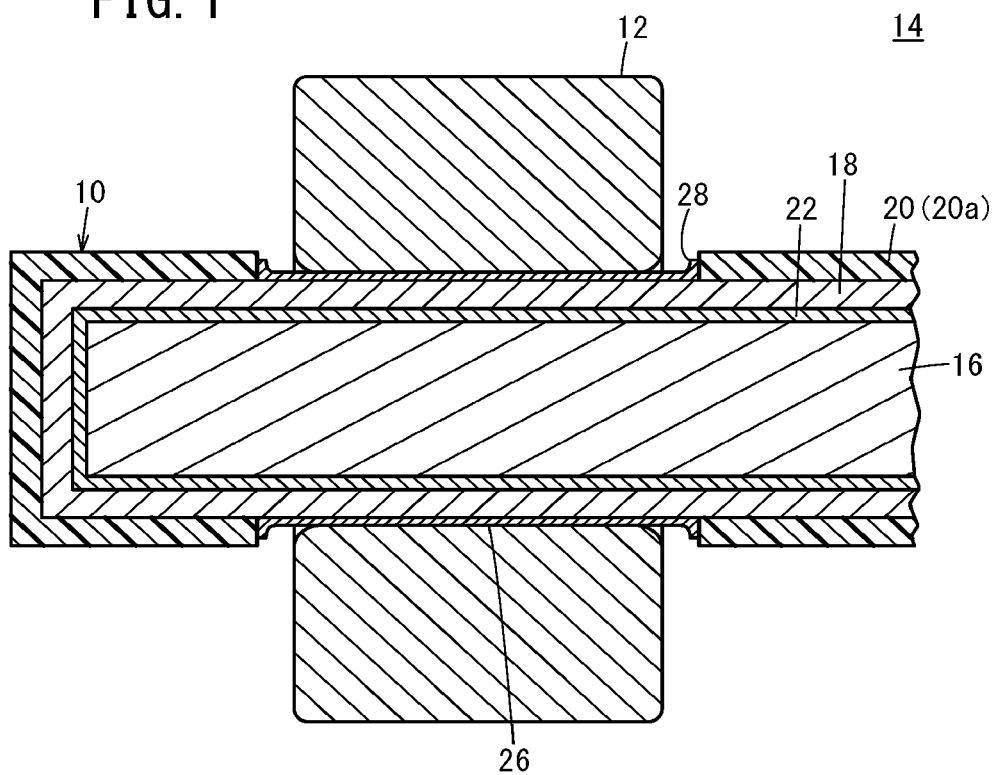
FIG. 1 is a schematic cross-sectional view of a principal part of a corrosion-resistant member according to an embodiment of the present invention and a mating member.

As shown in FIG. 1, a corrosion-resistant member 10 according to this embodiment is a shaft member for a rotary shaft, and is used together with a mating member 12 of a bearing member in a plain bearing apparatus 14. The corrosion-resistant member 10 has a base 16, a diamond-like carbon film (DLC film) 18, and a coating 20.

The base 16 is a solid shaft containing or consisting of aluminum or an aluminum alloy. Preferred examples of the aluminum alloys include A2017, A6060, ADC12, and A5052 according to Japanese Industrial Standards (JIS).

The DLC film 18 is formed on a surface of the base 16, and an intermediate layer 22 is interposed between the DLC film 18 and the base 16. The DLC film 18 contains or consists of an amorphous carbon (a-C) or a hydrogenated amorphous carbon (a-C:H). The a-C or a-C:H has a higher ratio of $sp^2$ bonds to $sp^3$ bonds as compared with a tetrahedral amorphous carbon (ta-C) or a hydrogenated tetrahedral amorphous carbon (ta-C:H). The a-C consists of carbon atoms, and the a-C:H contains a hydrogen atom.

The thickness of the DLC film 18 is preferably 1 to 4 μm, more preferably 2.5 to 3.5 μm. The Vickers hardness of the DLC film 18 is preferably 1,000 to 4,000 HV, more preferably 1,400 to 3,000 HV. By controlling the thickness and the Vickers hardness of the DLC film 18 within the above ranges, the slidability, the abrasion resistance, and the corrosion resistance of the corrosion-resistant member 10 can be appropriately improved as described hereinafter.

The intermediate layer 22 and the base 16 contain the same aluminum metal material, and the intermediate layer 22 and the DLC film 18 contain the same a-C or a-C:H (hereinafter referred to also as the DLC). In the intermediate layer 22, it is preferred that a portion closer to the base 16 contains a larger ratio of the aluminum material and a smaller ratio of the DLC. In other words, it is preferred that a portion farther from the base 16 contains a smaller ratio of the aluminum material and a larger ratio of the DLC. In this case, the aluminum/DLC composition ratio of the intermediate layer 22 may be gradually changed in the thickness direction, and thus the intermediate layer 22 may be a gradient layer. As a result, the intermediate layer 22 can be connected more firmly to each of the base 16 and the DLC film 18. The thickness of the intermediate layer 22 is not particularly limited, and may be about 0.01 to 1.0 μm.

Figure 2:
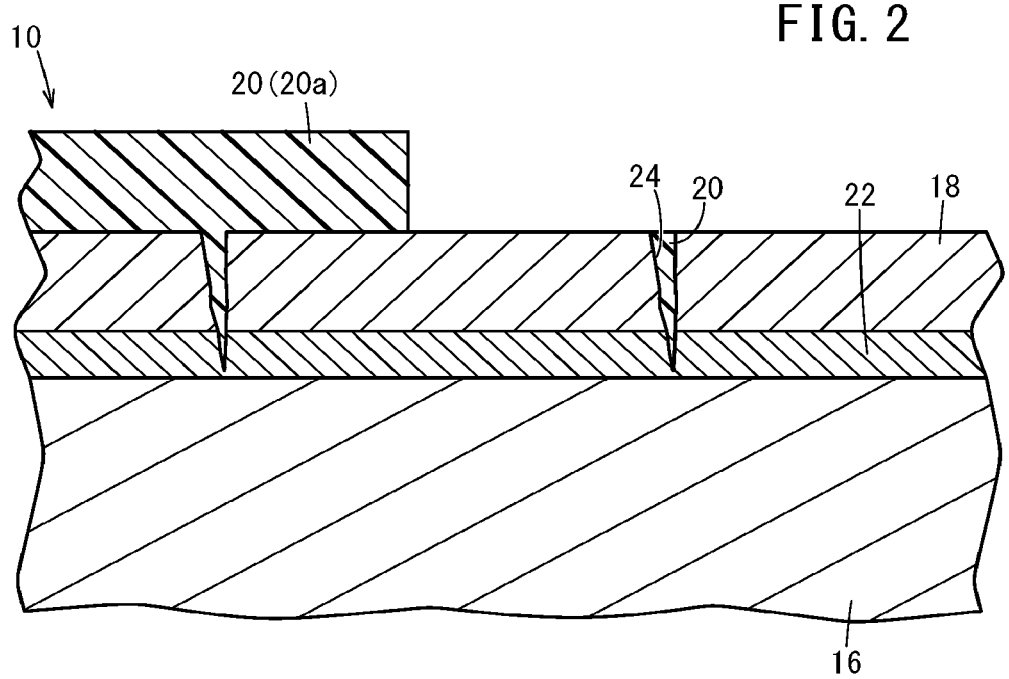
FIG. 2 is an enlarged cross-sectional view of a principal part of the corrosion-resistant member of FIG. 1.

FIG. 2 is an enlarged cross-sectional view of a principal part of the corrosion-resistant member 10. As shown in FIG. 2, the DLC film 18 and the intermediate layer 22 may have a defect of an open hole 24. The open hole 24 extends to the outside in the surface of the DLC film 18. At least the open hole 24 is filled with the coating 20. Thus, the open hole 24 of the DLC film 18 is closed by the coating 20.

In this embodiment, the open hole 24 is filled with the coating 20, and a portion of the DLC film 18 (a portion other than a sliding surface 26) is covered with a coating layer 20a of the coating 20. The sliding surface 26 is slid along the mating member 12 as described hereinafter, and also the open hole 24 in the sliding surface 26 is filled with the coating 20. The thickness of the coating layer 20a may be appropriately selected depending on the use and shape of the corrosion-resistant member 10, the usage environment, etc. For example, when the coating layer 20a has a thickness of 5 to 30 μm, the corrosion resistance of the corrosion-resistant member 10 can be appropriately improved.

The coating 20 contains an epoxy resin. It is preferred that the coating 20 further contains a titanium oxide and a carbon black or that the coating 20 further contains chromium oxide. In a case where the coating 20 contains the epoxy resin, the titanium oxide, and the carbon black, the mass ratio of the epoxy resin:the titanium oxide:the carbon black is preferably 5:1:1 to 20:10:10. In this case, the corrosion resistance, particularly the acid resistance, of the corrosion-resistant member 10 can be effectively improved.

On the other hand, in a case where the coating 20 contains the epoxy resin and the chromium oxide, the mass ratio of the epoxy resin:the chromium oxide is preferably 5:1 to 20:10. In this case, the corrosion resistance, particularly the alkali resistance, of the corrosion-resistant member 10 can be effectively improved.

As shown in FIG. 1, the mating member 12 is a bearing member for rotatably and slidably supporting the corrosion-resistant member 10. The inner surface of the mating member 12 is slid along the sliding surface 26 of the corrosion-resistant member 10. The material for the mating member 12 is not particularly limited. For example, the mating member 12 preferably contains a stainless steel, a polyacetal resin, a polytetrafluoroethylene (PTFE), or the like. The stainless steel for the mating member 12 is preferably SUS304, SUS303, SUS316, or the like. By appropriately selecting the material, abrasion of the sliding surface 26 and the mating member 12 can be effectively prevented, and the durabilities of the corrosion-resistant member 10 and the mating member 12 can be further improved as described hereinafter.

As shown in FIG. 1, it is preferred that a fluorine-based grease 28 is interposed between the sliding surface 26 of the corrosion-resistant member 10 and the inner surface of the mating member 12. The fluorine-based grease 28 is a lubricant for a food machinery, and the sliding surface 26 is covered with the fluorine-based grease 28. In this case, the abrasion of the sliding surface 26 and the mating member 12 can be appropriately prevented by the fluorine-based grease 28. The fluorine-based grease 28 has a corrosion resistance higher than those of the other greases, and can be safely brought into contact with the beverage or food.

The corrosion-resistant member 10 of this embodiment has the above basic structure. An example of a method for producing the corrosion-resistant member 10 will be described below.

First, the base 16 is subjected to a plasma cleaning treatment using an argon ion or the like. The intermediate layer 22 can be connected further firmly to the base 16 by performing the plasma cleaning treatment. Then, the intermediate layer 22 and the DLC film 18 are formed on the base 16 by a sputtering method using a graphite target and an inert gas such as an argon gas.

The method for forming the intermediate layer 22 and the DLC film 18 is not limited to the above sputtering method, and may be selected from known methods. For example, the DLC film 18 containing the a-C may be formed by a physical vapor deposition (PVD) method, and the DLC film 18 containing the a-C:H may be formed by a chemical vapor deposition (CVD) method.

Next, a resin material for forming the coating 20 is applied to the DLC film 18. For example, in a case where the coating 20 does not contain the titanium oxide, the carbon black, or the chromium oxide, the resin material for forming the coating 20 preferably contains 3% by mass of the epoxy resin and the balance of a solvent.

For example, in a case where the coating 20 contains the titanium oxide and the carbon black, the resin material preferably contains 5% to 20% by mass of the epoxy resin, 1% to 10% by mass of the titanium oxide, 1% to 10% by mass of the carbon black, and the balance of a solvent.

For example, in a case where the coating 20 contains the chromium oxide, the resin material preferably contains 5% to 20% by mass of the epoxy resin, 1% to 10% by mass of the chromium oxide, and the balance of a solvent.

In this application step, the open hole 24 in the DLC film 18 is filled with the resin material, and the entire DLC film 18 is covered with the resin material, to form an application layer. A known application method such as a brush coating method, a roller coating method, a spray coating method, a bar coating method, a roll coating method, a baking coating method, or an immersion coating method may be used in the application step.

Next, for example, the resin material applied to the base 16 is heated at a temperature of 180° C. or lower in a baking treatment. In the baking treatment, the resin material is hardened to form the coating 20. Thus, the open hole 24 in the DLC film 18 is filled with the coating 20, and the entire DLC film 18 is covered with the coating layer 20a of the hardened resin layer.

The coating 20 can be formed by the baking treatment at a relatively low temperature, at which the hardness of the base is not deteriorated, in this manner. Therefore, unlike a conventional technology containing a high-temperature baking treatment for forming a fluororesin coating, the hardness of the base 16 is not deteriorated due to a high temperature in the process of forming the coating 20.

Then, in a portion corresponding to the sliding surface 26 in the corrosion-resistant member 10, the coating 20 is removed, and the DLC film 18 is exposed from the coating layer 20a. The coating 20 may be removed by a known method such as a cutting method or a grinding method.

The corrosion-resistant member 10 is produced in the above manner. The plain bearing apparatus 14 is obtained by connecting the mating member 12 to the corrosion-resistant member 10 in such a manner that the inner surface of the mating member 12 can be slid along the sliding surface 26.

As described above, the corrosion-resistant member 10 has the base 16 containing the aluminum or aluminum alloy. The aluminum or aluminum alloy has a density lower than those of the stainless steel and the like, and requires lower material and processing costs. Therefore, the weight and the costs of the corrosion-resistant member 10 can be reduced by using the above-described base 16.

The DLC film 18 on the base 16 contains the a-C or a-C:H. The a-C or the a-C:H has a higher ratio of $sp^2$ bonds to $sp^3$ bonds and has a higher flexibility. Therefore, the DLC film 18 with a desired thickness can be appropriately bonded to the surface of the base 16 containing the relatively soft material of the aluminum or aluminum alloy. Furthermore, the DLC film 18 has a low friction coefficient and an excellent slidability, and has a high hardness and an excellent abrasion resistance. Therefore, by using the DLC film 18, the slidability and the abrasion resistance of the corrosion-resistant member 10 can be significantly improved.

The intermediate layer 22 containing the aluminum and the a-C or a-C:H is interposed between the DLC film 18 and the base 16. The intermediate layer 22 and the base 16 contain the same metal material, and therefore the intermediate layer 22 is compatible with the base 16. Similarly, the intermediate layer 22 and the DLC film 18 contain the same a-C or a-C:H, and therefore the intermediate layer 22 is compatible with the DLC film 18. Therefore, the intermediate layer 22 is firmly fixed to both of the base 16 and the DLC film 18. Thus, the DLC film 18 can be firmly connected to the base 16 by interposing the intermediate layer 22. Consequently, the DLC film 18 can be prevented from being peeled off from the base 16, and the sliding surface 26 of the corrosion-resistant member 10 can maintain the excellent slidability and abrasion resistance of the DLC film 18 for a long time.

The pores in the DLC film 18 and the intermediate layer 22 are closed by the coating 20, and the portions of the DLC film 18 (a portion other than the sliding surface 26) are covered with the coating layer 20a of the coating 20. The coating 20 contains the epoxy resin, and the epoxy resin has a corrosion resistance higher than those of the other resin materials and the like.

The open hole 24 is closed by the coating 20. Therefore, even when the corrosion-resistant member 10 is brought into contact with an acid, an alkali, or the like, the acid or alkali can be prevented from reaching the base 16 through the open hole 24. In addition, in the portion covered with the coating layer 20a in the corrosion-resistant member 10, the acid or alkali can be further effectively prevented from reaching the DLC film 18 or the base 16. Consequently, the corrosion-resistant member 10 has an excellent corrosion resistance not only against water and salt water but also against a strong acid, a strong alkali, and a disinfecting/sanitizing agent such as sodium hypochlorite.

Furthermore, in a case where the coating 20 further contains the titanium oxide and the carbon black, the corrosion resistance of the corrosion-resistant member 10 can be further improved, and particularly the acid resistance can be significantly improved. Therefore, the resultant corrosion-resistant member 10 can exhibits an excellent corrosion resistance even against a strong acid.

In a case where the coating 20 further contains the chromium oxide, the corrosion resistance of the corrosion-resistant member 10 can be further improved, and particularly the alkali resistance can be significantly improved. Therefore, the resultant corrosion-resistant member 10 can exhibits an excellent corrosion resistance even against a strong alkali.

In the sliding surface 26 of the DLC film 18 exposed from the coating layer 20a, it is possible to take the advantages of the excellent slidability and abrasion resistance of the DLC film 18 effectively. Thus, the slidability and the abrasion resistance of the corrosion-resistant member 10 can be improved by forming the sliding surface 26. The open hole 24 in the sliding surface 26 of the DLC film 18 is filled with the coating 20. Therefore, the corrosion-resistant member 10 can maintain the excellent corrosion resistance even when the sliding surface 26 is formed. Consequently, the corrosion-resistant member 10 has all of the excellent slidability, abrasion resistance, and corrosion resistance.

The present invention is not particularly limited to the above embodiment, and various changes and modifications may be made therein without departing from the scope of the invention.

For example, although the corrosion-resistant member 10 has the intermediate layer 22 in the above embodiment, the corrosion-resistant member 10 does not have to have the intermediate layer 22.

Although the corrosion-resistant member 10 has the sliding surface 26 in the above embodiment, the corrosion-resistant member 10 does not have to have the sliding surface 26, and the entire DLC film 18 may be covered with the coating layer 20a. In this case, particularly the corrosion resistance of the corrosion-resistant member 10 can be improved. Therefore, the corrosion-resistant member 10 can be suitably used as a member other than the sliding member required to have a high corrosion resistance. Meanwhile, the entire DLC film 18 may be exposed without forming the coating layer 20a on the corrosion-resistant member 10. In this case, the entire corrosion-resistant member 10 has the excellent slidability and abrasion resistance.

The present invention will be described in detail below referring to Examples without intention of restricting the scope of the invention.

Example 1

A solid A6061-T6 shaft having a diameter of 10 mm and a length of 50 mm was subjected to a mirror-polishing surface treatment to prepare a base 16. An intermediate layer 22 and a DLC film 18 were formed on the base 16. The total thickness was 2.0 to 2.2 μm, and the average Vickers hardness of the surface of the DLC film 18 was 1350 HV. The average Vickers hardness was an average of three values measured by a method according to JIS Z 2244 under a load of 10 gf. The same applies hereinafter.

A resin material for forming the coating 20 contained 3.0% by mass of an epoxy resin, 17.0% by mass of xylene, 11.0% by mass of ethylbenzene, 5.0% to 10.0% by mass of n-butanol, 1.0% to 5.0% by mass of isobutanol, 1.0% to 5.0% by mass of ethylene glycol monobutyl ether, 0.1% to 1.0% by mass of methanol, 0.8% by mass of formaldehyde, 16.0% by mass of a melamine resin, and 37.0% by mass of an alkyd resin. The resin material was applied to the DLC film 18 and subjected to a baking treatment, so that an open hole 24 of the DLC film 18 was closed by a coating 20, and the entire DLC film 18 was covered with a coating layer 20a having a thickness of 22.0 to 26.0 μm, to produce a corrosion-resistant member 10. This corrosion-resistant member 10 is used as a test member of Example 1. In Example 1, the surface of the coating layer 20a had an average Vickers hardness of 12 HV.

Example 2

A corrosion-resistant member 10 was produced as a test member of Example 2 in the same manner as Example 1 except that the resin material for forming the coating 20 contained 5% to 20% by mass of an epoxy resin, 1% to 10% by mass of a titanium oxide, 1% to 10% by mass of a carbon black, 5% to 15% by mass of xylene, 15% to 25% by mass of methyl ethyl ketone, 5% to 15% by mass of 2-ethoxyethyl acetate, 10% to 20% by mass of toluene, and 1% to 10% by mass of ethylene glycol monobutyl ether and that the coating layer 20a had a thickness of 21.0 to 25.0 μm. Thus, the coating 20 in the test member of Example 2 contained the titanium oxide and the carbon black. In Example 2, the surface of the coating layer 20a had an average Vickers hardness of 50 HV.

Example 3

A corrosion-resistant member 10 was produced as a test member of Example 3 in the same manner as Example 1 except that the resin material contained 5% to 20% by mass of an epoxy resin, 1% to 10% by mass of chromic oxide, 15% to 25% by mass of 1,2-dichloroethane, 5% to 15% by mass of methyl isobutyl ketone, 5% to 15% by mass of methyl ethyl ketone, 10% to 20% by mass of diacetone alcohol, 10% to 20% by mass of ethanol and that the coating layer 20a had a thickness of 25.0 to 30.0 μm. Thus, the coating 20 in the test member of Example 3 contained the chromium oxide. In Example 3, the surface of the coating layer 20a had an average Vickers hardness of 20 HV.

Examples 4 to 6

A corrosion-resistant member 10 was produced as a test member of Example 4 in the same manner as Example 1 except for using A2017 as a material of the base 16. A corrosion-resistant member 10 was produced as a test member of Example 5 in the same manner as Example 2 except for using A2017 as a material of the base 16. A corrosion-resistant member 10 was produced as a test member of Example 6 in the same manner as Example 2 except for using ADC12 as a material of the base 16.

Comparative Example 1

The base 16 prepared in Example 1 was used as a test member of Comparative Example 1. Thus, the test member of Comparative Example 1 does not have the intermediate layer 22, the DLC film 18, and the coating 20.

Comparative Example 2

A corrosion-resistant member 10 was produced as a test member of Comparative Example 2 in the same manner as Example 1 except that the coating 20 was not formed. Thus, in the test member of Comparative Example 2, the pore of the DLC film 18 was not closed by the coating 20.

Comparative Examples 3 to 5

The base 16 prepared in Example 1 was subjected to an anode oxidation treatment to form an anodic oxide coating ($Al_2O_3$) having a thickness of 13.0 to 16.0 μm, whereby a test member of Comparative Example 3 was produced. The anodic oxide coating in the test member of Comparative Example 3 was closed by and covered with the coating 20 of Example 1 to form a coating layer 20a having a thickness of 22.0 to 26.0 μm, whereby a test member of Comparative Example 4 was produced. A test member of Comparative Example 5 was produced in the same manner as Comparative Example 4 except for using the coating 20 of Example 2. In the test members of Comparative Examples 3 to 5, the surface of the anodic oxide coating had an average Vickers hardness of 320 HV.

Comparative Example 6

A test member of Comparative Example 6 was produced in the same manner as Example 4 except for not using the coating 20. Thus, in the test member of Comparative Example 6, the pore of the DLC film 18 was not closed by the coating 20.

Corrosion resistance evaluation tests were carried out using the test members of Examples 1 to 6 and Comparative Examples 1 to 6 and seven different liquids A to G. A first corrosion resistance evaluation test for evaluating the corrosion resistances of the test members of Examples 1 to 3 and Comparative Examples 1 to 3 and 5 against Liquid A (pH 3.5) of a pilsner-type beer was carried out. Specifically, the entire test member was immersed in Liquid A at the ordinary temperature for 30 days, and the weight of the test member was measured before and after the immersion to obtain the weight change. The test member having a smaller weight change was judged to be prevented from being corroded and to have a higher corrosion resistance.

A second corrosion resistance evaluation test for evaluating the corrosion resistances of the test members of Examples 1 to 5 and Comparative Examples 1 to 3, 5, and 6 against Liquid B (pH 1.0) was carried out in the same manner as the above first test. Liquid B was an aqueous solution containing 3.0% by mass of an acidic detergent for a food-related product, and the acidic detergent contained 35.0% by mass of a phosphoric acid as a main component.

A third corrosion resistance evaluation test for evaluating the corrosion resistances of the test members of Examples 1 to 4 and Comparative Examples 1 to 3, 5, and 6 against Liquid C (pH 11.0) was carried out in the same manner as the above first test. Liquid C was an aqueous solution containing 3.0% by mass of an alkaline detergent for a food-related product, and the alkaline detergent contained 15.0% by mass of sodium hydroxide as a main component.

A fourth corrosion resistance evaluation test for evaluating the corrosion resistances of the test members of Examples 1 to 3 and Comparative Example 5 against Liquid D (pH 12.0) was carried out in the same manner as the above first test. Liquid D was an aqueous solution containing 0.04% by mass of sodium hydroxide.

A fifth corrosion resistance evaluation test for evaluating the corrosion resistances of the test members of Examples 1 to 3 against Liquid E (pH 13.0) was carried out in the same manner as the above first test. Liquid E was an aqueous solution containing 0.4% by mass of sodium hydroxide.

A sixth corrosion resistance evaluation test for evaluating the corrosion resistances of the test members of Examples 1 to 6 and Comparative Example 5 against Liquid F (pH 14.0) was carried out in the same manner as the above first test. Liquid F was an aqueous solution containing 4.0% by mass of sodium hydroxide.

A seventh corrosion resistance evaluation test for evaluating the corrosion resistances of the test members of Examples 1 to 3 and Comparative Examples 1, 3, and 4 against Liquid G was carried out in the same manner as the above first test. Liquid G was an aqueous solution containing 500 ppm concentration of sodium hypochlorite (a sanitizing/disinfecting agent). Furthermore, the corrosion resistances of the test members of Examples 4 and 5 against Liquid G were evaluated in the same manner as the above first test except that the test member was immersed in Liquid G for 17 days.

The results of the first to seventh test are shown in Table 1.

TABLE 1

| | Weight change (mg) | | | | | | |
|---|---|---|---|---|---|---|---|
| | Liquid A pH 3.5 | Liquid B pH 1.0 | Liquid C pH 11.0 | Liquid D pH 12.0 | Liquid E pH 13.0 | Liquid F pH 14.0 | Liquid G Disinfecting agent |
| Ex. 1 | 0.6 | 2.1 | 2.6 | 2.7 | 81.7 | 3310.2 | 0.2 |
| Ex. 2 | 0.3 | 0.4 | 0.3 | 0.8 | 21.2 | 51.0 | 0.2 |
| Ex. 3 | 0.7 | 1.2 | 0.3 | 0.3 | 1.7 | 4.9 | 0.2 |
| Ex. 4 | — | 1.5 | 0.6 | — | — | 937.9 | 0.2 |
| Ex. 5 | — | 0.1 | — | — | — | 8.4 | 0.3 |
| Ex. 6 | — | — | — | — | — | 84.9 | — |
| Comp. Ex. 1 | 1.3 | 25.9 | 269.0 | — | — | — | 2.5 |
| Comp. Ex. 2 | 1.1 | 19.7 | 137.6 | — | — | — | — |
| Comp. Ex. 3 | 1.2 | 16.6 | 272.4 | — | — | — | 1.5 |
| Comp. Ex. 4 | — | — | — | — | — | — | 0.7 |
| Comp. Ex. 5 | 0.4 | 0.8 | 0.5 | 0.8 | — | 3208.1 | — |
| Comp. Ex. 6 | — | 11.9 | 119.3 | — | — | — | — |

As is clear from Table 1, the test members of Examples 1 to 6 having both of the DLC film 18 and the coating 20 had more excellent corrosion resistances against all of Liquids A to G, as compared with the test member of Comparative Example 1 having only the base 16, the test members of Comparative Examples 2 and 6 having only the DLC film 18, and the test member of Comparative Example 3 having only the anodic oxide coating.

The test members of Examples 2, 5, and 6 having the coating 20 containing the epoxy resin, the titanium oxide, and the carbon black had excellent corrosion resistances against all of Liquids A to G, and had particularly excellent corrosion resistances against the strong acids of Liquids A and B.

The test member of Example 3 having the coating 20 containing the epoxy resin and the chromium oxide had excellent corrosion resistances against all of Liquids A to G, and had particularly excellent corrosion resistances against the strong alkalis of Liquids C to F.

It is clear from the above results that the corrosion-resistant member 10 according to the embodiment of the present invention exhibits excellent corrosion resistances against the strong acid, the strong alkali, and the disinfecting/sanitizing agent such as sodium hypochlorite because the DLC film 18 is closed by and covered with the coating 20 containing the epoxy resin.

Furthermore, in a case where the coating 20 further contains the titanium oxide and the carbon black in addition to the epoxy resin, the corrosion resistance can be further improved, and particularly the acid resistance can be significantly improved.

Meanwhile, in a case where the coating 20 further contains the chromium oxide in addition to the epoxy resin, the corrosion resistance can be further improved, and particularly the alkali resistance can be significantly improved.

As described above, the DLC film 18 used in Examples 1 to 6 had the Vickers hardness of 1350 HV, which is significantly larger than the Vickers hardness of 320 HV of the anodic oxide coating used in Comparative Examples 3 to 5. Furthermore, the DLC film 18 had the excellent slidability and abrasion resistance, while the anodic oxide coating cannot have the excellent properties. Therefore, the corrosion-resistant member 10 having the DLC film 18 is excellent also in the slidability and abrasion resistance.

In contrast, the test members of Comparative Examples 4 and 5 had the anodic oxide coating, and the pores of the anodic oxide coating were closed by the coating 20. As a result, although the test members of Comparative Examples 4 and 5 had higher corrosion resistances as compared with the test member of Comparative Example 1 having no coatings, the test members of Comparative Examples 4 and 5 were poor in the slidability and abrasion resistance.

Next, a corrosion-resistant member 10 was produced as a test member in the same manner as Example 5 except that the base 16 had a disk shape with a diameter of 40 mm and a thickness of 7 mm and that the coating layer 20a was partly removed to form a sliding surface 26 in an end surface. The sliding surface 26 was subjected to a frictional wear evaluation test using a ball-on-disk method. In the ball-on-disk method, a plurality of different materials were used for mating members, the test member was used as a disk, and the mating member was used as a pin.

Specifically, the frictional wear evaluation test was carried out under a load of 1 kgf, a linear speed of 1,000 mm/second, a rotation speed of 660 rpm, and a sliding distance of 1 km. The mating member was a solid shaft having a diameter of 10 mm. A stainless steel (SUS303), a polyacetal resin (POM), a polytetrafluoroethylene (PTFE), a high silicon alloy (NH41), an aluminum alloy for die casting (ADC12), a lead bronze casting (LBC), a brass (C3604), an aluminum bronze casting (CAC703), and a carbon steel for a mechanical structure (S45C) were each used as a material of the mating member. The results are shown in Table 2.

TABLE 2

| Material | | Abrasion loss volume (mm³) | |
|---|---|---|---|
| Disk | Pin (mating member) | Disk | Pin (mating member) |
| Corrosion-resistant member 10 | SUS303 | 0.010 | 0.004 |
| | POM | 0.001 or less | 0.548 |
| | PTFE | 0.001 or less | 5.917 |
| | NH41 | 0.020 | 0.002 |
| | ADC12 | 0.032 | 0.037 |
| | LBC | 0.046 | 3.750 |
| | C3604 | 0.050 | 9.097 |
| | CAC703 | 0.033 | 1.250 |
| | S45C | 0.034 | 0.025 |

As is clear from Table 2, in the case where the sliding surface 26 of the corrosion-resistant member 10 was slid along the SUS303 of the mating member, the abrasion loss volumes of both of the corrosion-resistant member 10 and the mating member could be reduced. Furthermore, in the case where the sliding surface 26 of the corrosion-resistant member 10 was slid along the POM or PTFE of the mating member, the abrasion loss volume of the corrosion-resistant member 10 could be effectively reduced.

Thus, when the corrosion-resistant member 10 according to the embodiment of the present invention is used in combination with the mating member 12 containing the stainless steel, the polyacetal resin (POM), or the polytetrafluoroethylene (PTFE), the abrasion of both of the sliding surface 26 and the mating member 12 can be effectively prevented to improve the durabilities of the corrosion-resistant member 10 and the mating member 12.

The invention claimed is:

1. A corrosion-resistant member having acid resistance and comprising a base, a diamond-like carbon film, and a coating that contains epoxy resin, titanium oxide and carbon black,
   wherein the base contains aluminum or an aluminum alloy,
   the diamond-like carbon film is formed on a surface of the base and contains amorphous carbon or hydrogenated amorphous carbon, wherein the diamond-like carbon film has an open hole, and
   at least the open hole of the diamond-like carbon film is filled with the coating, and
   wherein a mass ratio in the coating of the epoxy resin:the titanium oxide:the carbon black is in a range from 5:1:1 to 20:10:10.

2. A corrosion-resistant member having alkalai resistance and comprising a base, a diamond-like carbon film, and a coating that contains epoxy resin and chromium oxide,
   wherein the base contains aluminum or an aluminum alloy,
   the diamond-like carbon film is formed on a surface of the base and contains amorphous carbon or hydrogenated amorphous carbon, wherein the diamond-like carbon film has an open hole, and
   at least the open hole of the diamond-like carbon film is filled with the coating, and
   wherein a mass ratio in the coating of the epoxy resin:the chromium oxide is in a range of 5:1 to 20:10.

3. The corrosion-resistant member according to claim 1, further comprising an intermediate layer interposed between the diamond-like carbon film and the surface of the base, wherein the intermediate layer includes a gradient layer in which a portion farther from the base contains a smaller ratio of aluminum and a larger ratio of diamond-like carbon.

4. The corrosion-resistant member according to claim 1, wherein the coating forms a coating layer that covers at least a part of the diamond-like carbon film.

5. The corrosion-resistant member according to claim 4, wherein the diamond-like carbon film includes a sliding surface exposed from the coating layer while the open hole is filled with the coating.

6. The corrosion-resistant member according to claim 5, wherein the sliding surface is slid along a mating member that contains a stainless steel, a polyacetal resin, or a polytetrafluoroethylene.

7. The corrosion-resistant member according to claim 6, wherein the mating member contains a stainless steel of SUS304, SUS303, or SUS316.

8. The corrosion-resistant member according to claim 6, wherein a fluorine-based grease is interposed between the sliding surface and the mating member.

9. The corrosion-resistant member according to claim 6, wherein the corrosion-resistant member is a shaft member, and the mating member is a bearing member for the shaft member.

10. The corrosion-resistant member according to claim 1, wherein the corrosion-resistant member is a member of an apparatus for treating a beverage or a food.

\* \* \* \* \*